US011973071B2

(12) United States Patent
Noebauer et al.

(10) Patent No.: US 11,973,071 B2
(45) Date of Patent: Apr. 30, 2024

(54) SEMICONDUCTOR MODULE

(71) Applicant: Infineon Technologies Austria AG, Villach (AT)

(72) Inventors: Gerhard Noebauer, Villach (AT); Sergey Yuferev, Villach (AT)

(73) Assignee: Infineon Technologies Austria AG, Villach (AT)

( * ) Notice: Subject to any disclaimer, the term of this patent is extended or adjusted under 35 U.S.C. 154(b) by 455 days.

(21) Appl. No.: 17/307,123

(22) Filed: May 4, 2021

(65) Prior Publication Data

US 2021/0351168 A1    Nov. 11, 2021

(30) Foreign Application Priority Data

May 8, 2020  (EP) ..................... 20173688

(51) Int. Cl.
*H01L 23/538* (2006.01)
*H01L 23/50* (2006.01)
*H01L 25/16* (2023.01)
*H03K 17/687* (2006.01)

(52) U.S. Cl.
CPC .............. *H01L 25/16* (2013.01); *H01L 23/50* (2013.01); *H01L 23/5389* (2013.01); *H03K 17/6871* (2013.01); *H03K 2217/0063* (2013.01); *H03K 2217/0072* (2013.01)

(58) Field of Classification Search
CPC ...................... H01L 25/16; H01L 23/50; H01L 2224/04105; H01L 2224/06181; H01L 2224/20; H01L 2224/24; H01L 2224/2405; H01L 2224/24105; H01L 2224/24137; H01L 2224/32245; H01L 2224/37; H01L 2224/37011; H01L 2224/40; H01L 2224/40137; H01L 2224/73263; H01L 2224/73267; H01L 2924/13091; H01L 2924/30107; H01L 23/49524; H01L 23/49562; H01L 23/49575; H01L 23/49589; H01L 23/642; H01L 23/5389; H01L 25/072; H01L 23/5286;
(Continued)

(56) References Cited

U.S. PATENT DOCUMENTS

2003/0011049 A1*  1/2003 Nuytkens ............ H01L 21/4846
                                                  257/E23.178
2007/0262346 A1    11/2007 Otremba et al.
(Continued)

FOREIGN PATENT DOCUMENTS

WO       2014202282 A1    12/2014

*Primary Examiner* — Bitew A Dinke
(74) *Attorney, Agent, or Firm* — Murphy, Bilak & Homiller, PLLC

(57) ABSTRACT

In an embodiment, a semiconductor module includes a low side switch and a high side switch. The low side switch and the high side switch are arranged laterally adjacent one another and coupled in series between a ground package pad and a voltage input (VIN) package pad of the semiconductor module and form a half bridge configuration having an output node. The semiconductor module further includes a first capacitor pad coupled to ground potential and a second capacitor pad coupled to a VIN potential. The first capacitor pad is arranged vertically above the low side switch and the second capacitor pad is arranged vertically above the high side switch.

17 Claims, 10 Drawing Sheets

(58) Field of Classification Search
CPC ....... H03K 17/6871; H03K 2217/0063; H03K 2217/0072; H02M 3/00
See application file for complete search history.

(56) References Cited

U.S. PATENT DOCUMENTS

| | | | |
|---|---|---|---|
| 2010/0078783 A1* | 4/2010 | Otremba | H01L 23/142 257/676 |
| 2011/0108971 A1* | 5/2011 | Ewe | H01L 23/5389 438/109 |
| 2011/0127675 A1* | 6/2011 | Ewe | H01L 25/0655 257/773 |
| 2013/0020694 A1* | 1/2013 | Liang | H01L 23/473 257/691 |
| 2013/0162367 A1* | 6/2013 | Tanaka | H03H 9/706 333/133 |
| 2013/0221442 A1 | 8/2013 | Joshi | |
| 2013/0328213 A1* | 12/2013 | Otremba | H01L 23/5389 257/773 |
| 2015/0028487 A1* | 1/2015 | Meyer-Berg | H01L 25/16 257/773 |
| 2015/0116022 A1 | 4/2015 | Hughes et al. | |
| 2015/0216054 A1* | 7/2015 | Standing | H01L 25/072 228/180.21 |
| 2015/0318242 A1* | 11/2015 | Li | H01L 23/642 257/296 |
| 2017/0345714 A1* | 11/2017 | Scharf | H01L 24/36 |
| 2018/0059749 A1* | 3/2018 | Chen | H01L 23/5286 |
| 2019/0274219 A1* | 9/2019 | Gottwald | H05K 3/32 |
| 2020/0029455 A1* | 1/2020 | Hong | H01L 23/492 |
| 2020/0043881 A1* | 2/2020 | Lin | H01L 23/5226 |
| 2021/0175184 A1* | 6/2021 | Hong | H01L 23/367 |
| 2021/0202357 A1* | 7/2021 | Poddar | H01L 24/45 |
| 2022/0093573 A1* | 3/2022 | Kessler | H01L 24/20 |
| 2023/0130659 A1* | 4/2023 | Cho | H01L 24/20 257/773 |

* cited by examiner

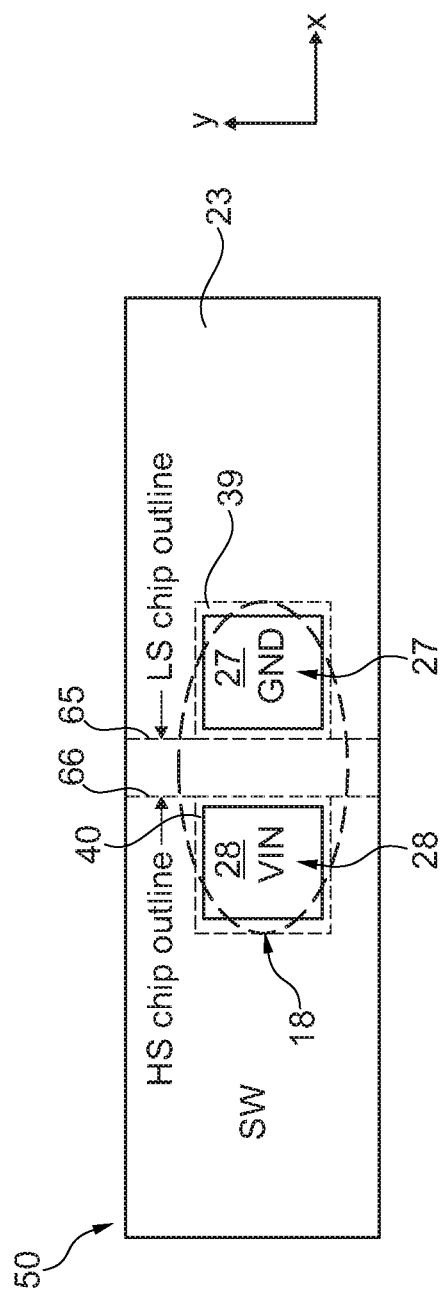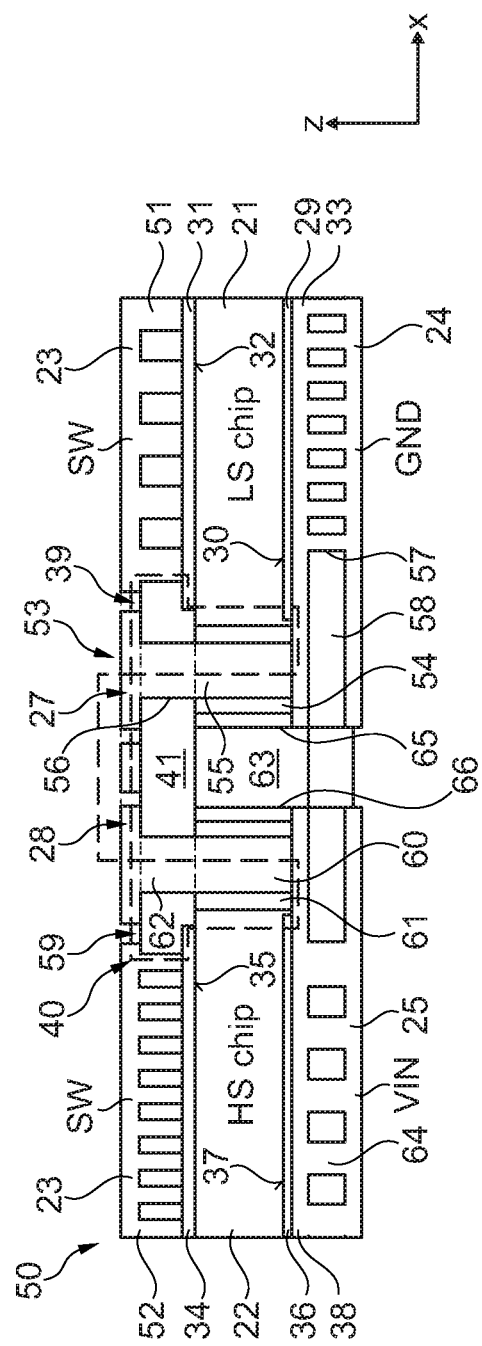
Fig. 3A
Fig. 3B

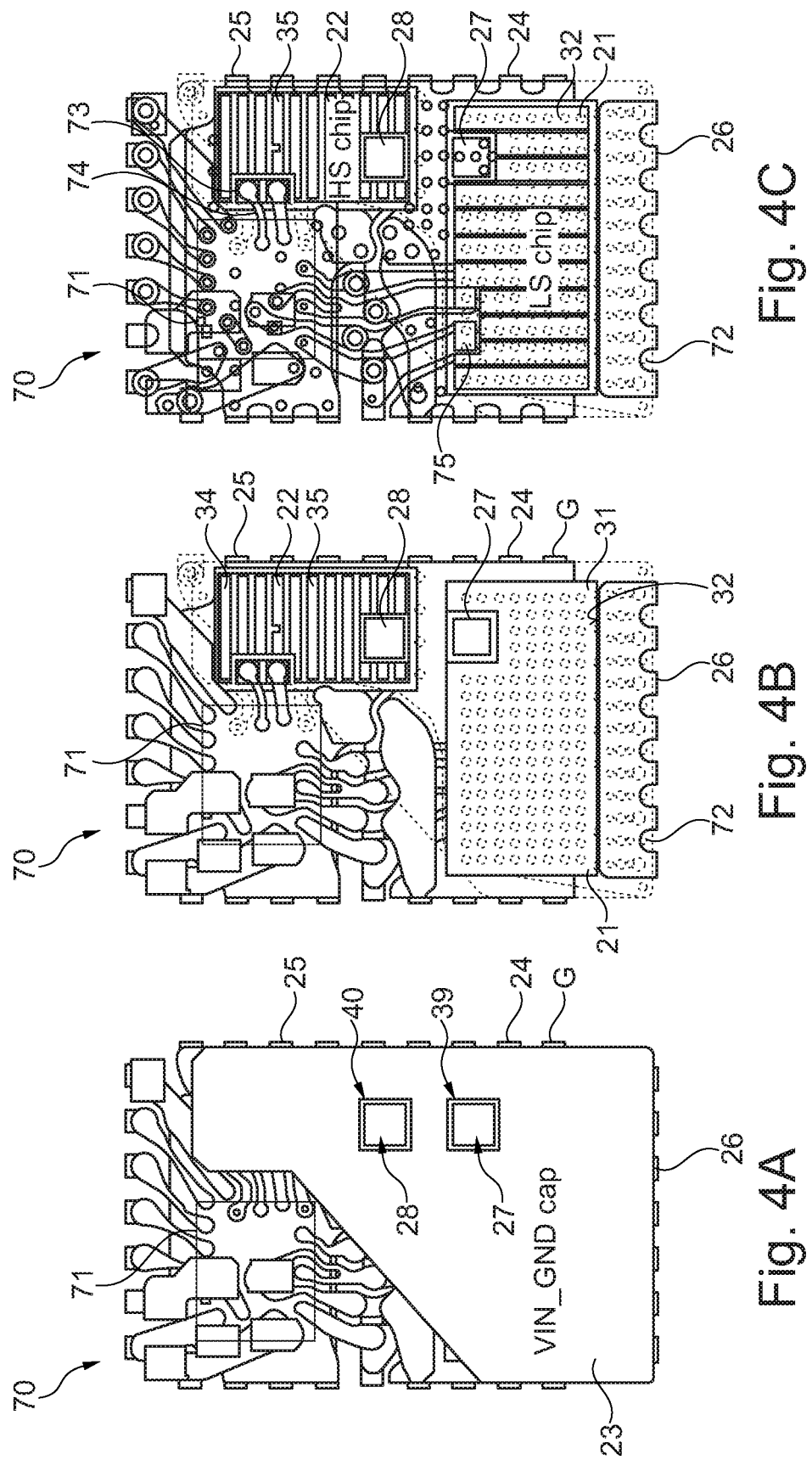

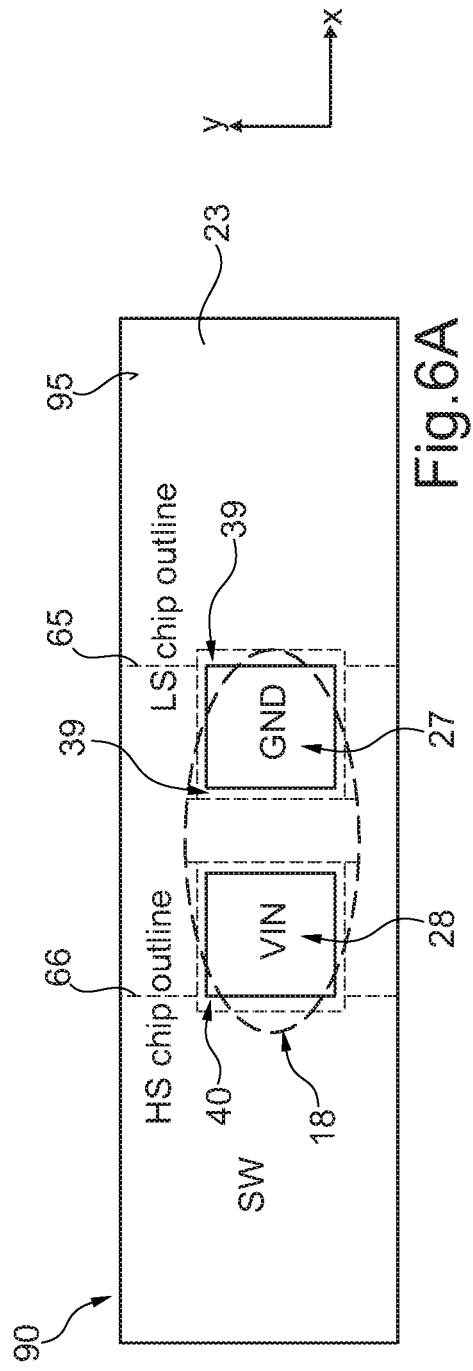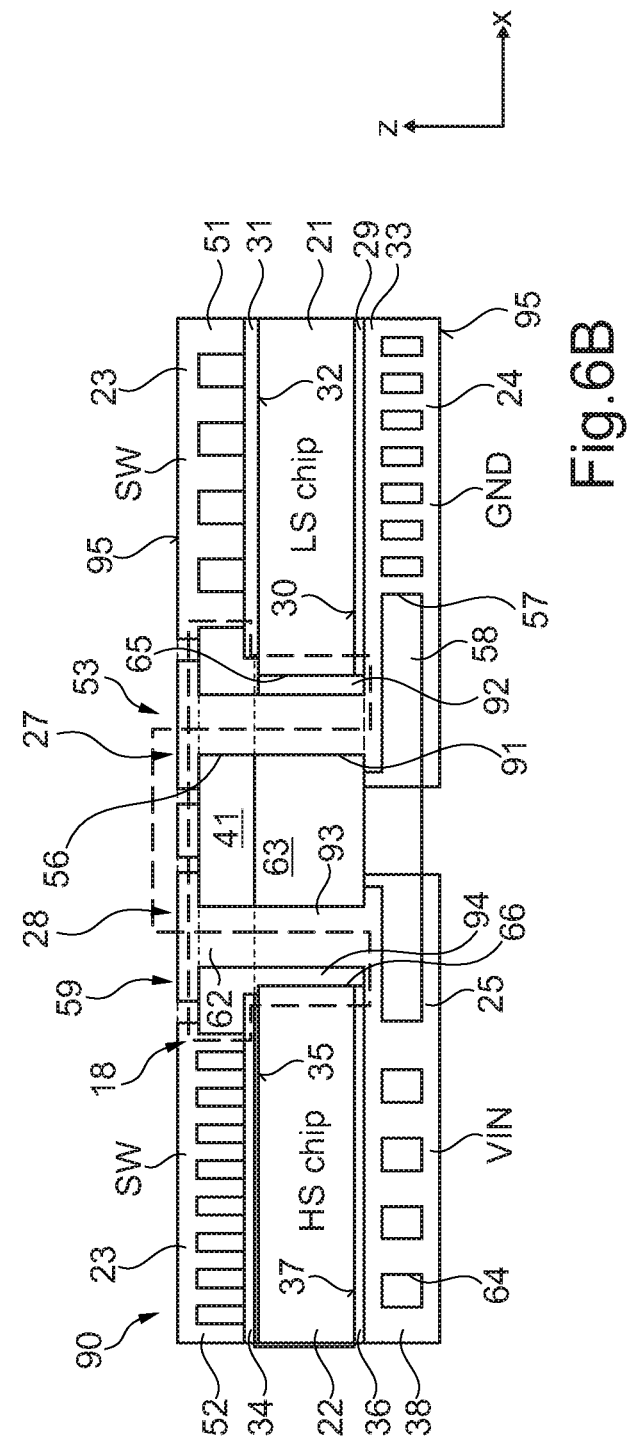

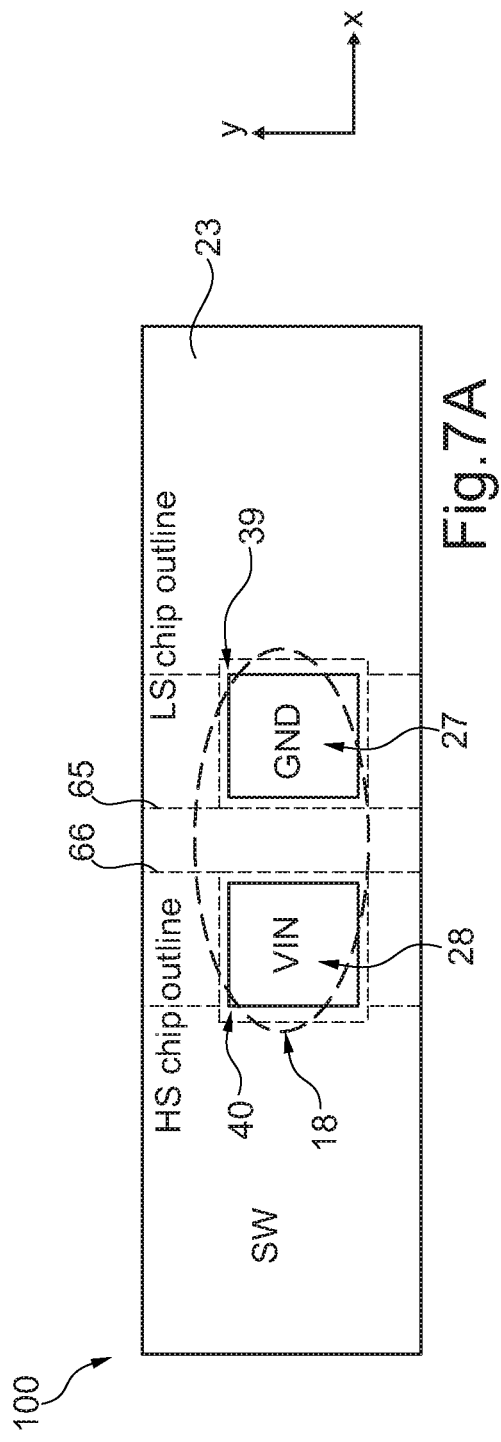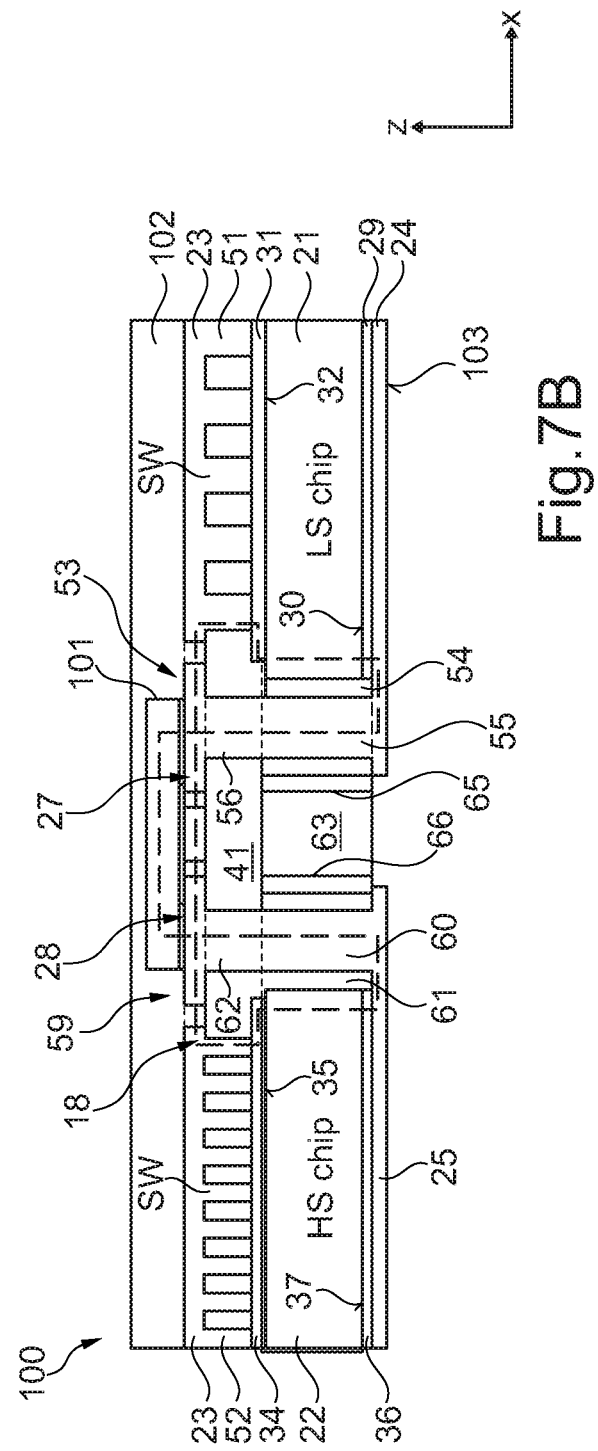

SEMICONDUCTOR MODULE

BACKGROUND

A semiconductor package may include one or more semiconductor devices in a housing. The package may include a substrate or a leadframe which includes outer contacts which are used to mount the package on a redistribution board such as a printed circuit board and internal electrical connections from the semiconductor device to the substrate or leadframe. The housing may be formed from a plastic molding compound which covers the semiconductor device and the internal electrical connections.

US 2013/0221442 A1 discloses a package with an embedded power stage that includes two field effect transistors arranged in a stack and having a half-bridge configuration. The field effect transistors are embedded in a dielectric substrate that is formed from multiple dielectric layers that are laminated together with one or more foil layers that help to form an electrical interconnect for the package. The power stage may be used as a component in a DC/DC converter, for example.

It is desirable to further improve the efficiency and reliability of semiconductor packages providing a power stage.

SUMMARY

According to the invention, a semiconductor module is provided that comprises a low side switch and a high side switch. The low side switch and the high side switch are arranged laterally adjacent one another and coupled in series between a ground package pad and a voltage input (VIN) package pad of the semiconductor module and form a half bridge configuration having an output node. The semiconductor module further comprises a first capacitor pad coupled to ground potential and a second capacitor pad coupled to a VIN potential. The first capacitor pad is arranged vertically above the low side switch and the second capacitor pad is arranged vertically above the high side switch.

In some embodiments, the low side switch comprises a first side and a second side opposing the first side, a source pad on the first side and a drain pad on the second side, wherein the source pad of the low side switch is connected to a first conductive layer and the first capacitor pad is arranged vertically above the drain pad of the low side switch.

In some embodiments, the high side switch comprises a first side and a second side opposing the first side, a source pad on the first side and a drain pad on the second side, wherein the drain pad of the high side switch is connected to a second conductive layer that is substantially coplanar with the first conductive layer. The second capacitor pad is arranged vertically above the source pad of the high side switch.

In some embodiments, the output node is formed by a third conductive layer extending between the drain pad of the low side switch and the source pad of the high side switch.

In some embodiments, the third conductive layer comprises a first opening in which the first capacitor pad is arranged and a second opening in which the second capacitor pad is arranged. This embodiment may be used for semiconductor modules fabricated using lamination type processes, e.g. an embedded chip module, in which the third conductive layer is deposited and built up layer by layer.

In some embodiments, the third conductive layer comprises an opening in which the first capacitor pad and the second capacitor pad are arranged. This embodiment may be used for an embedded chip module or for a semiconductor module in which the third conductive layer is provided by a contact clip which is prefabricated and attached to the drain pad of the low side switch and the source pad of the high side switch. The capacitor can also be arranged in the opening and coupled to the first and second capacitor pads.

In some embodiments, the third conductive layer is spaced apart from the drain pad of the low side switch and the source pad of the high side switch by an electrically insulating layer and the first capacitor pad is electrically insulated from the drain pad of the low side switch by the electrically insulating layer.

In some embodiments, the semiconductor module further comprises a first vertical conductive connection that electrically couples the first capacitor pad with a ground layer of the semiconductor module.

In some embodiments, the first vertical conductive connection comprises a conductive via extending through and electrically insulated from a body of the low side switch.

In some embodiments, the first vertical conductive connection comprises a conductive via extending on a side face of the low side switch and electrically insulated from the body of the low side switch.

In some embodiments, the semiconductor module further comprises a second vertical conductive connection that electrically couples the second capacitor pad with VIN potential.

In some embodiments, the second vertical conductive connection is provided by a conductive via extending through and electrically insulated from a body of the high side switch, or a conductive via extending on a side face of the body of the high side switch and electrically insulated from the body of the high side switch.

In some embodiments, the second vertical conductive connection is provided by a body of the high side switch and the second capacitor pad is arranged on the first side of the high side switch. The second capacitor pad is electrically coupled to the drain pad of the high side switch by way of the body of the high side switch. The body of the high side switch may be formed of highly doped semiconductor material and be electrically conductive.

In some embodiments, the ground package pad and the VIN package pad are arranged on a first side of the semiconductor module, the ground package contact pad is coupled to the ground layer and the first conductive layer and the VIN package contact pad is coupled to the second conductive layer.

In some embodiments, the first conductive layer provides the ground layer. In some embodiments, the first conductive layer provides the ground package pad.

In some embodiments, the second conductive layer is coupled to the VIN package pad. In some embodiments, the second conductive layer provides the VIN package pad.

In some embodiments, the semiconductor module further comprises a control chip.

In some embodiments, the semiconductor module further comprises at least one further half bridge configuration comprising a low side switch and a high side switch.

In some embodiments, the semiconductor module further comprises a capacitor extending between and electrically connected to the first capacitor pad and the second capacitor pad. The capacitor is electrically coupled between the ground and VIN package pads.

In some embodiments, the first capacitor pad and the second capacitor pad are exposed from an upper electrically insulating layer forming an outer surface of the semiconductor module. In these embodiments, a capacitor may be mounted on the module and be freely accessible.

In some embodiments, the first capacitor pad and the second capacitor pad are positioned within an upper electrically insulating layer forming an outer surface of the semiconductor module. In these embodiments, a capacitor may be embedded within the module, for example in the upper electrically insulating layer.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 3A and 3B illustrate a top view and a cross-sectional view, respectively, of a semiconductor module according to an embodiment.

FIGS. 4A to 4D illustrate respective top views of a semiconductor module and FIG. 4E illustrates a cross-sectional view of the low side switch along the line A-A of FIG. 4D.

FIGS. 6A and 6B illustrate a top view and a cross-sectional view, respectively, of a semiconductor module according to an embodiment.

FIGS. 7A and 7B illustrate a top view and a cross-sectional view, respectively, of a semiconductor module according to an embodiment.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
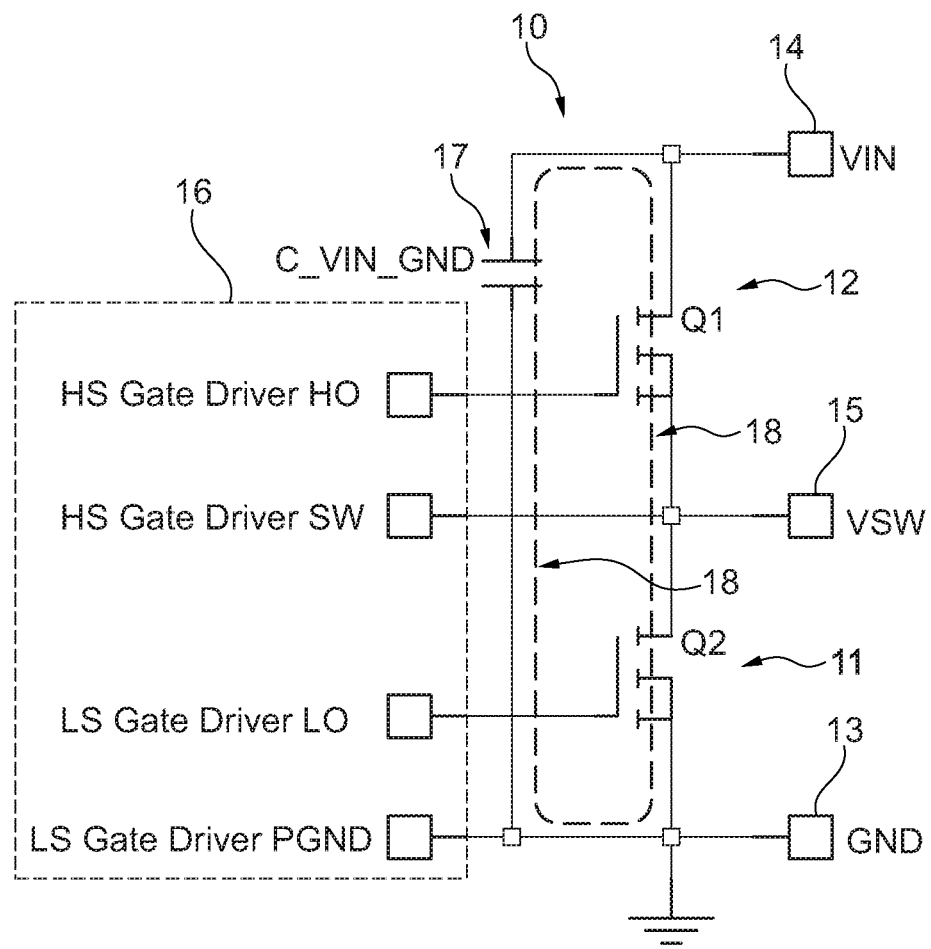
FIG. 1 illustrates a circuit diagram of a power stage including two transistor devices and a decoupling capacitor.

FIG. 1 illustrates a circuit diagram of a power stage circuit 10 including a low side switch 11 and a high side switch 12 which are electrically coupled in series between a ground (GND) terminal 13 and a voltage input (VIN) terminal 14 and have a half-bridge configuration having an output (VSW) node 15. The low side switch 11 and high side switch 12 may each be formed by a transistor device, for example a field effect transistor device such as a MOSFET device. The source of the transistor device forming the low side switch 11 is electrically coupled to the ground terminal 13 and the drain of the transistor device forming the low side switch 11 is electrically coupled to the output node 15. The source of the transistor device forming the high side switch 12 is electrically coupled to the output node 15 and the drain of the transistor device forming the high side switch is electrically coupled to the VIN terminal 14. The gate of the low side switch 11 and the gate of the high side switch 12 are each electrically coupled to a terminal of gate driver circuitry 16. The circuit 10 further includes a capacitor 17 which is coupled between the ground terminal 13 and the VIN terminal 14 and which serves as a decoupling capacitor.

One parameter of very fast switching power stage circuits is parasitic stray loop inductance. Parasitic stray loop inductance directly affects the amplitude of drain source voltage spikes during the switching of the transistors. The spikes can potentially exceed the voltage ratings of the transistors and have a significant impact on the safe operation of the power stage. These spikes are, therefore, undesirable. When the high side switch 12 is turned off, energy in the loop inductance will charge up the drain source voltage VDS at the high side switch 12 and, for higher currents, the high side switch 12 will go into avalanche leading to carrier stress in the device. Additionally, the energy stored in the loop inductance will be lost, which has a negative effect on efficiency when the power stages operated a high current and high frequency.

The power loop involves both transistors and is closed by including the capacitor 17 which acts as a VIN-ground decoupling capacitor and provides high bandwidth power supply during fast switching events. The power loop is indicated in FIG. 1 by the dotted line 18. The inductance value of the power loop depends on the loop area; the smaller the area, the shorter the power current path and the smaller the inductance value. According to the invention, the power loop inductance is reduced by improvements to the package design including the position of the capacitor 17 with respect to the low side switch 11 and high side switch 12.

According to the invention, a semiconductor module is provided, in which the low side switch 11 and high side switch 12 are arranged laterally adjacent one another and form a half bridge circuit. Pads, onto which the decoupling capacitor 17 can be mounted, are arranged vertically above the low side switch 11 and the high side switch 12. The semiconductor module therefore provides a power stage with a small size, a shorter power current path and a lower loop inductance. In some embodiments, the semiconductor module also includes a capacitor mounted on the pads. FIGS. 2 to 7B illustrate embodiments of semiconductor modules having such arrangements. The loop inductance of the power stage provided by these semiconductor modules is reduced to less than 0.2 nH or less than 0.15 nH.

Figure 2:
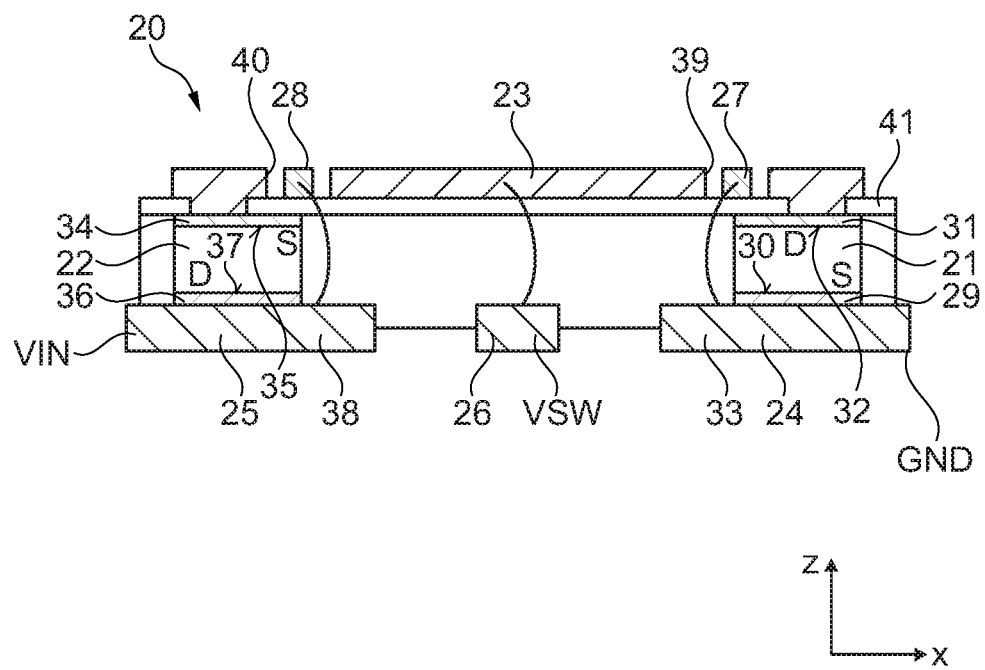
FIG. 2 illustrates a schematic cross-sectional view of a semiconductor module according to an embodiment.

FIG. 2 illustrates a semiconductor module 20 according to an embodiment including a low side switch 21, a high side switch 22 that are arranged laterally adjacent one another and coupled in series by a connector 23. The low side switch 21 and the high side switch 22 are coupled between a ground package pad 24 and a VIN package pad 25 to form half bridge configuration having an output node 26. The semiconductor module 20 further includes a first capacitor pad 27 which is coupled to ground potential and a second capacitor pad 28 which is coupled to a VIN potential. The first capacitor pad 27 is arranged vertically above the low side switch 21 and the second capacitor pads 28 is arranged vertically above the high side switch 22.

In some embodiments, the ground package pad 24 is coupled to a potential that is greater than 0 but less than VIN and may be denoted as a low voltage package pad.

As used herein, the term "vertically above" encompasses arrangements in which the first capacitor pad 27 partially vertically overlaps the low side switch 21, i.e. partially overlaps in the z direction in the Cartesian coordinate system, and completely vertically overlaps with low side switch 21. Similarly, the term includes arrangements in which the second capacitor pad 28 partially vertically overlaps the high side switch 22 and completely vertically overlaps the high side switch 22.

The low side switch 21 may be provided by a transistor device, such as field effect transistor, for example a MOSFET device. The high side switch 22 may also be provided by transistor device, such as field effect transistor, such as a MOSFET device. The low side switch 21 and the high side switch 22 may be formed in two separate semiconductor dies as shown in the drawings. However, in other non-illustrated embodiments, the low side switch 21 and the high side switch 22 may be formed in a common semiconductor die and laterally adjacent one another in the common semiconductor die.

The first capacitor pad 27 may be coupled to the ground pad 24 in order to couple the first capacitor pad 27 to ground potential. The second capacitor pad 28 may be electrically coupled to the VIN package pad 25 in order to electrically couple the second capacitor pad 28 to VIN potential. The connector 23, which is used to couple the low side switch 21 and the high side switch 22 in series, may be electrically coupled to the output node terminal 26 of the package.

In some embodiments, the transistor device providing the low side switch 21 and the transistor device providing the high side switch 22 are vertical transistor devices, each including a vertical drift path. In some embodiments, the low side switch 21 includes a source pad 29 on a first side 30 of the low side switch 21 and a drain pad 31 on the second side 32 which opposes the first side 30. The source pad 29 of the low side switch 21 is mounted on and electrically connected to a first conductive layer 33 and can be considered to face downwards such that the drain pad 31 faces upwards. In this embodiment, the first capacitor pad 27 is arranged vertically above the drain pad 31 of the low side switch 21. The first conductive layer 33 may be formed by a portion of a lead frame, for example a die pad which may also provide the ground package pad 24 of the semiconductor module 20.

The high side switch 22 comprises a source pad 34 on a first side 35 and a drain pad 36 on a second side 37 opposing the first side 35. The drain pad 36 is mounted on and electrically connected to a second conductive layer 38. The drain pad 36 of the high side switch 22 therefore faces downwards and the source pad 34 faces upwards. The second capacitor pad 28 is arranged vertically above the source pad 34 of the high side switch 22. The second conductive layer 38 is substantially coplanar with the first conductive layer 33 on which the low side switch 21 is mounted so that the low side switch 21 and high side switch 22 are arranged laterally adjacent to one another within the module 20.

The connector 23 may be formed by a third conductive layer 23 which extends between the drain pad 31 of the low side switch 21 and the source pad 34 of the high side switch 22. The connector 23 is electrically coupled to the output node 26 of the semiconductor module 23. The third conductive layer 23 may be formed by a metallic foil or deposited metallic layer. In other embodiments, the connector 23 may be formed by a pre-fabricated clip.

In some embodiments, the third conductive layer 23 comprises a first opening 39 in which the first capacitor pad 27 is arranged and a second opening 40 in which the second capacitor pad 28 is arranged. The first and second capacitor pads 27, 28 are spaced apart and electrically insulated from the surrounding third conductive layer 23. The first and second capacitor pads 27, 28 and the third conductive layer 23 may be substantially coplanar. The arrangement of the capacitor pads 27, 28 in openings 39, 40 of the third conductive layer 23 enables the third conductive layer 23 to have a large area and low resistance whilst allowing the capacitor pads 27, 28 to be arranged near to the low side switch 21 and high side switch 22 so that the power current path is short and the loop inductance can be reduced.

In the embodiment illustrated in FIG. 2, the third conductive layer 23 is spaced apart from the drain pad 32 of the low side switch 21 and the source pad 34 the high side switch 22 by an electrically insulating layer 41. The first capacitor pad 27 is electrically insulated from the drain pad 32 by the intervening electrically insulating layer 41. The second capacitor pad 28 is electrically insulated from the source pad 34 above which it is situated by an intervening portion of the electric insulating layer 41.

By arranging the pads 27, 28 for a decoupling capacitor directly above at least part of the low side switch 21 and the high side switch 22, a compact arrangement is provided over an arrangement in which the capacitor is arranged laterally adjacent the high side switch 22 and the low side switch 21 or in which the capacitor is positioned outside of the module 20. Additionally, the distance between the low side switch 21, the high side switch 22 and the capacitor pads 27, 28 is reduced which enables the distance between the switches 21, 22 and capacitor pads 27, 28 to be reduced and the inductance values of the power loop to be decreased.

In some embodiments, the first capacitor pad 27 is electrically coupled with a ground layer of the semiconductor module by means of a vertical conductive connection. The ground layer may be the conductive layer on which the source pad 29 of the low side switch 21 is mounted or may be a layer that is separate from the layer on which the source pad 29 of the low side switch 21 is mounted. FIGS. 3A to 7B illustrate semiconductor modules including a vertical conductive connection between the first capacitor pad 27 and a ground layer of the semiconductor module according to various embodiments.

FIG. 3A illustrates a top view and FIG. 3B a cross-sectional view of a semiconductor module 50 according to an embodiment. Similar to the embodiment illustrated in FIG. 2, the semiconductor module 50 includes the low side switch 21 and high side switch 22 which are arranged laterally adjacent one another and which are electrically coupled in series by the electrically conductive layer 23. The low side switch 21 is provided by a vertical transistor device and has a source pad 29 on a first side 30 which is mounted on and electrically connected to a first conductive layer 33 which is coupled to ground package pad 24. The drain pad 31 arranged on the opposing second side 32 faces upwardly and is electrically connected to the conductive layer 23. The high side switch 22 is also provided by a vertical transistor device and has a drain pad 36 arranged on the second side 37 which is arranged on and electrically connected to a second conductive layer 38 which is coupled to a VIN package pad 25. The source pad 34 arranged on the first surface 35 faces upwardly and is electrically coupled to the third conductive layer 23.

As can be more easily seen in the top view of FIG. 3A, the third conductive layer 23 includes the first opening 39 in which the first capacitor pad 27 is arranged and the second opening 40 in which the second capacitor pad 28 is arranged. The first capacitor pad 27 is spaced apart from the side walls defining the opening 39 so that the first capacitor pad 27 is electrically insulated from the third conductive layer 23. The first opening 39 and therefore the first capacitor pad 27 are arranged vertically above the second side 32 of the low side switch 31. The second capacitor pad 28 is spaced apart from the side walls defining the second opening 40 so that the first capacitor pad 28 is electrically insulated from the third conductive layer 23. The second opening 40 and the second capacitor pad 28 are arranged vertically above the first side 35 of the high side switch 22.

The electrically insulating layer 41 is arranged on the second side 32 of the low side switch and extends across the gap between the low side switch 21 and the high side switch 22 and over the first side of the high side switch 22. The electrically insulating layer 41 spaces the third conductive layer 23 vertically above the upper surface of the low side switch 21 and the high side switch 22 and also spaces the capacitor pads 27, 28 apart from and electrically insulates the first and second capacitor pads 27, 28 from the drain pad 31 and the source pad 34 on the upper surfaces of the first low side switch 21 and the high side switch 22, respectively.

The third conductive layer 23 is electrically coupled to the drain pad 35 by a plurality of conductive vias 51 which extend through the electrically insulating layer 41. The source pad 34 of the high side switch 22 is electrically coupled to the third conductive layer 23 by plurality of conductive vias 52 that extend through the electrically insulating layer 41. The side faces of the low side switch 21 and high side switch 22 are embedded in a further dielectric layer 63 on which the electrically insulating layer 41 is arranged.

In the embodiment illustrated in FIGS. 3A and 3B, the first capacitor pad 27 is electrically coupled to the first conductive layer 33 and to the ground package pad 24 by a vertical conductive connection 53 which extends vertically in the z direction between the first capacitor pad 27 and the first conductive layer 33. Part of the vertical connection 53 is positioned in and extends through the body of the low side switch 21. The vertical connection 53 is formed by a conductive via 55 which extends between the second side 32 and the first side 30 of the low side switch 21. The conductive via 55 is electrically insulated from the material of the low side switch 21 by electrical insulation 54 which lines the sidewalls of via formed in the low side switch 21. The conductive via 55 arranged in the low side switch 21 extends into a conductive via 56 which extends through the electrically insulating layer 41 which is positioned on the second side 32 of the low side switch 21. The vertical connection 53 is, therefore, formed by the stack of the conductive vias 55 and 56.

In the embodiment illustrated in FIGS. 3A and 3B, the ground package pad 24 is positioned vertically beneath the low side switch 21 and the first conductive layer 33 and is spaced apart from the first conductive layer 33 by a further insulation layer 58.

The first conductive layer 33 is electrically connected to the ground package pad 24 by a plurality of conductive vias 57 which extend through the further insulation layer 58 and between the ground package pad 24 and the first conductive layer 33.

In the embodiment illustrated in FIGS. 3A and 3B, the second capacitor pad 28 is electrically coupled to the VIN package pad 25 by a vertical conductive connection 59 which extends between the second capacitor pad 28 and the second conductive layer 38. The second vertical connection 59 comprises a conductive via 60 which is positioned in and extends through the body of the high side switch 22 from the first side 34 to the second side 36 and which is electrically insulated from the body of the high side switch 22 by electrical insulation 61 which lines the sidewalls of a via or through hole arranged in the material of the high side switch 22. A conductive via 62 is also positioned between the first surface 34 of the high side switch 22 and the second capacitor pad 28 that extends through the electrically insulating layer 41 and is positioned above and is connected to the conductive via 60. The VIN package pad 33 is positioned vertically beneath the high side switch 22. The second conductive layer 38 is electrically connected to the VIN package pad 33 by a plurality of conductive vias 64 which extend through the second electrically insulating layer 58.

The semiconductor module 50 can be formed from a stack of substantially planar electrically insulating layers, 58, 63, 41 and conductive layers 24, 25, 26; 33, 38; 23, with the low side switch 21 and high side switch 22 being embedded in the layer 63 of electrically insulating material. The semiconductor module 50 can be considered to have a laminated or embedded structure. The conductive layers are connected in the vertical direction by conductive vias. In some embodiments, one or more of the electrically insulating layers and adjoining conductive layers may be formed from a preformed interposer arrangement, for example a circuit board type arrangement.

The power loop 18 of the power stage is indicated in FIGS. 3A and 3B by the dashed lines. The stacked arrangement of the capacitor pads 27, 28 above the low side switch 21 and high side switch 22, respectively enables a smaller distance between the half bridge configuration and the capacitor extending between the capacitor pads 27, 28 which leads to a reduction in the effective loop area. Additionally, current flows along the surface of the vias 55, 60 reducing the vertical loop and reducing the inductance of the power loop 18, for example to less than 0.2 nH.

In the embodiment illustrated in FIGS. 3A and 3B, the capacitor pads 27, 28 have a lateral area and a position such that the area in the xy plane entirely overlaps the underlying low side switch 21 and high side switch 22, respectively, in the vertical or z direction as can be seen by the position of the side faces 65, 66 of the low side switch 21 and high side switch 22. In other embodiments, the capacitor pads 27, 28 may partially vertically overlap the low side switch 21 and high side switch 22, respectively. For example, a portion of the first capacitor pad 27 extend above and across one or more of the side faces of the low side switch 21 such that a portion of it is positioned laterally adjacent the one or more side faces of the low side switch 21 and vertically above the electrically insulating layer 63.

FIGS. 4A to 4C illustrate three top views of a semiconductor module 70 which includes the arrangement illustrated in FIGS. 3A and 3B. FIG. 4A illustrates a top view in which the third conductive layer 23 is shown. FIG. 4B illustrates a top view in which the third conductive layer 23 has been removed and the low side switch 21, high side switch 22 can be seen. The position of the first capacitor pad 27 above the low side switch 21 and the second capacitor pad 28 above the high side switch 22 are also illustrated. FIG. 4C illustrates a top view in which the lowermost conductive layer providing the VIN package pad 38, the ground package pad 33 and conductive vias 64 are illustrated.

As can most easily be seen in FIG. 4B, the low side switch 21 is positioned towards a first lateral side of the package module 70 and extends across majority of the width of the semiconductor module 70. The low side switch 21 and the high side switch 22 each have a substantially rectangular form and, in this embodiment, the low side switch 21 has a larger area than the high side switch 22. In other embodiments, the low side switch 21 and the high side switch 22 may have substantially the same area. The high side switch 22 is arranged such that its long side is substantially perpendicular to the long side of the low side switch 21.

The semiconductor module 70 also includes a control chip 71 which may include gate driver circuitry for driving the gates of the low side switch 21 and the high side switch 22. The control chip 71 is arranged laterally adjacent the low side switch 21 and high side switch 22.

The first capacitor pad 27 is positioned vertically above the low side switch 21. In this embodiment, the entire area of the first capacitor pad 27 vertically overlaps the top side of the low side switch 21. Similarly, the second capacitor pad 28 is positioned above and its area entirely overlaps with the upper surface of the high side switch 22. The capacitor pads 27, 28 are positioned towards the side faces 65, 66 of the low side switch 21 and high side switch 22, respectively, that face on another and are substantially aligned with one another such that a capacitor can be mounted on the capacitor pads 27, 28 which extends across the gap between the side faces 65, 66 of the low side switch 21 and high side switch 22 and substantially perpendicularly to the side faces 65, 66.

The semiconductor module 70 includes an output terminal 26 which is positioned laterally adjacent and peripheral to the low side switch 21 and which extends across substantially the width of the module 70. The third conductive layer 23 which provides the series connection between the drain 34 of the low side switch 21 and the source 31 of the high side switch 22 has a lateral extent such that it is positioned above the entire area of the low side switch 21, the entire area of the high side switch 22 and the entire area of the output node terminal 26. The area of the conductive layer 23 is increased by including an inclined face between the portions positioned above the high side switch 22 of the low side switch 21 such that a portion of the third conductive layer 23 is positioned above the region of the module 70 arranged between the high side switch 22, low side switch 21 and the control chip 71. This increase in area of the conductive layer 23 is made possible since the contact pads 27, 28 for the capacitor are positioned within openings 39, 40 of the third conductive layer 23 above the low side switch 21 and high side switch 22, respectively, rather than being positioned laterally adjacent the third conductive layer 23 and laterally adjacent low side switch 21 high side switch 22, for example, between the control chip 71 and the side faces of the high side switch 22 and low side switch 21.

The third conductive layer 23 may extend in a single plane above the top sides 32, 35 of the high side switch 22 and the low side switch 21 and above the top surface of the output node terminal 23. The conductive layer 23 can be electrically coupled to the source pad 34 of the high side switch 22 and the drain pad 31 of the low side switch 21 by a plurality of conductive vias 52, 51 and to the upper surface of the upper conductive node 23 by a plurality of conductive vias 72.

In the top view of FIG. 4C, the position of the gate pad 73 on the top side 35 of the high side switch 22 can be seen. The gate pad 73 is electrically connected to the control chip 71 by conductive connections 74. The low side switch 21 has a source down arrangement such that the gate pad 75 is positioned on the lower surface 29 adjacent the source pad 30.

Figure 4D:
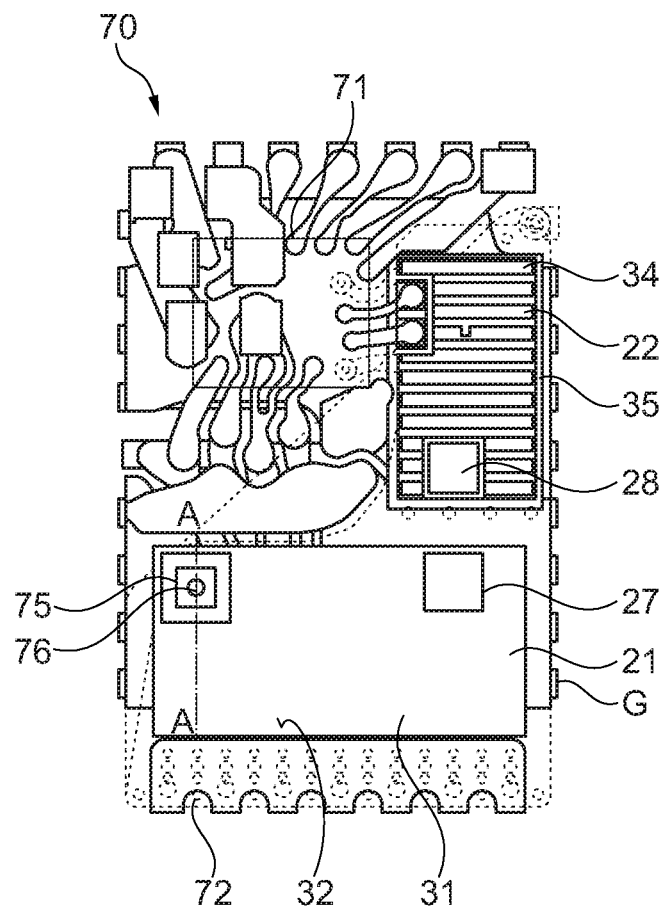
Figure 4E:
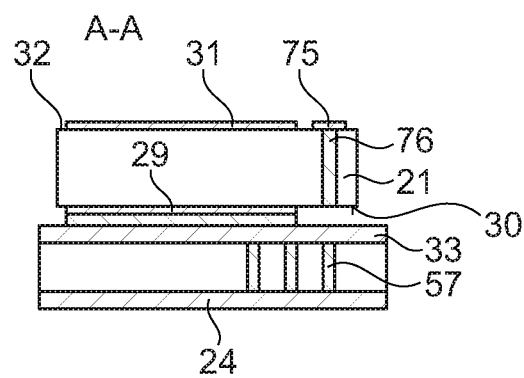

FIG. 4D illustrates a top view of a semiconductor module 70 according to an embodiment and FIG. 4E a cross-sectional view of the low side switch 21 along the line A-A of FIG. 4D. The semiconductor module 70 has a similar layout to that shown in FIGS. 4A to 4C, but differs in the arrangement of the gate pad 75 of the low side switch 21. In the embodiment illustrated in FIGS. 4D and 4E, the low side switch 21 has a source down arrangement and includes a through silicon via 76 so that the gate pad 75 is arranged on the upper surface 32 adjacent the drain pad 31 of the low side switch 21.

Figure 5A:
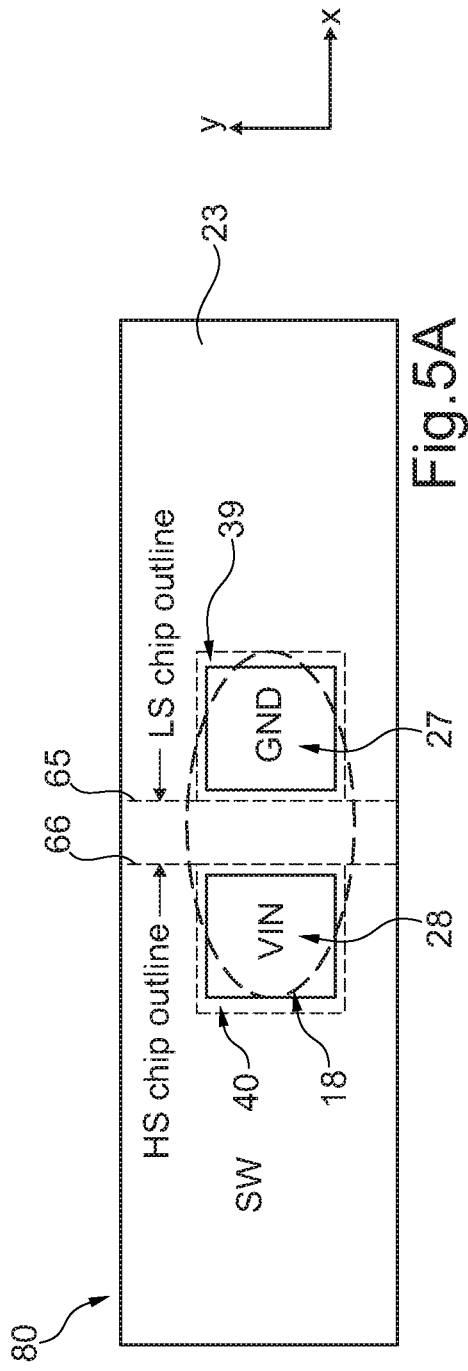
FIG. 5A illustrates a top view and FIG. 5B a cross-sectional view of a semiconductor module according to an embodiment.
Figure 5B:
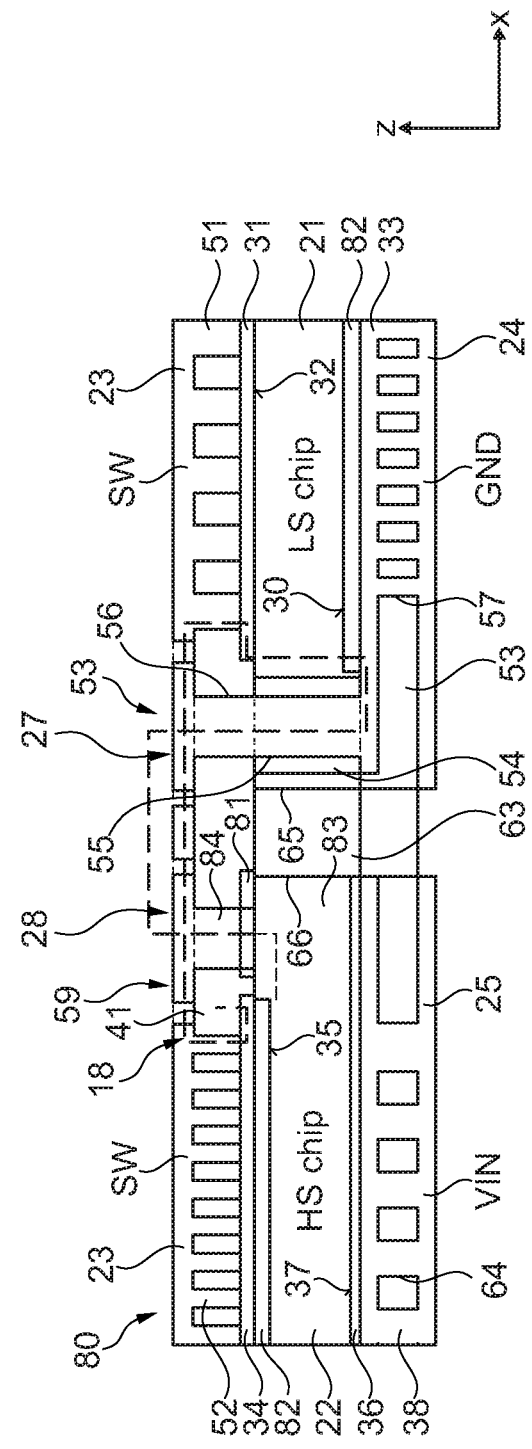
FIG. 5C illustrates a cross-sectional view of a semiconductor module according to an embodiment.
FIG. 5D illustrates a cross-sectional view of a semiconductor module according to an embodiment.

FIG. 5A illustrates a top view and FIG. 5B a side view of a semiconductor module 80 providing a power stage including two switches having a half bridge configuration and pads for a decoupling capacitor according to an embodiment. The arrangement of the semiconductor module 80 differs from the semiconductor module 50 illustrated in FIGS. 3A and 3B by the vertical conductive connection 59 which is used to electrically couple the second capacitor pad 28 to the second conductive layer 38 and VIN potential.

In the semiconductor module 80, the high side switch 22 includes a conductive pad 81 on its first surface 35 which is positioned adjacent to the source pad 34 and adjacent to the active region of the transistor device which is indicated schematically by the block 82. For MOSFET devices, the active region 82 typically includes the active trenches of the transistor device. In this embodiment, the body 83 of the high side switch 22, i.e. the semiconductor material of the die providing the vertical transistor device and the high side switch 22, is at VIN potential. The body 83 is formed of a highly doped semiconductor, typically highly doped silicon, in regions outside of the active area 82. The body 83 is coupled to the second conductive layer 38 by means of the drain pad 36 on the opposing side 37 of the high side switch 22. The pad 81 positioned on the opposing upper side 35 side switch 22 is also coupled to the second conductive layer 38 and VIN potential by means of the body of the high side switch 22.

Figure 5C:
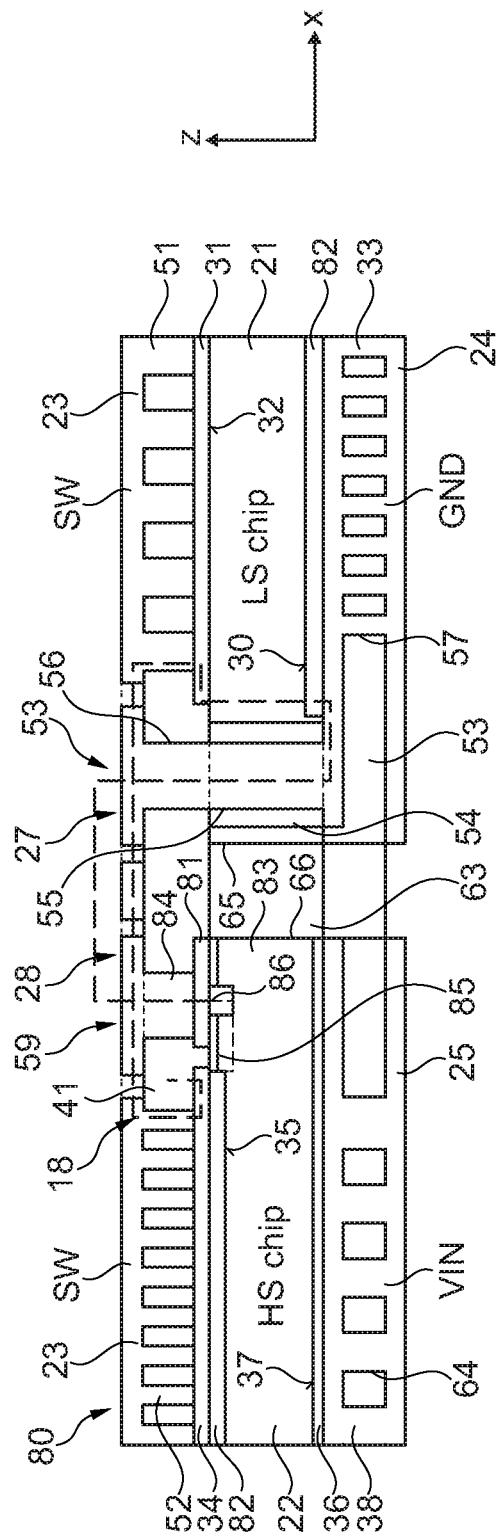

FIG. 5C illustrates a cross-sectional view of a semiconductor module 80 which differs from the embodiment illustrated in FIGS. 5A and 5B in the arrangement of the connection between the pad 81 and the body 83. The uppermost portion of the active region 82 has a certain doping level which due to the process is similar to the doping level in the uppermost portion of the inactive region of the body 83, indicated in FIG. 5C with the reference number 85. This top region 85 has a higher resistance and a larger contribution to the overall resistance of the connection between the pad 81 and the drain pad 36 positioned on the opposing side of the high side switch 22. This resistance can be reduced by including a sinker 86 formed from a region of the body 83 that includes a higher doping level. The sinker 86 is positioned adjacent the active region 82 and extends from the upper side 35 through the lower doped region 85 to at least the highly doped region of the body 83. In some embodiments, the sinker extends to the opposing lower side 37 of the high side switch 22.

The second capacitor pad 28, which is positioned above the high side switch 22, is positioned above this pad 81 on the first surface 35 of the high side switch 22. The second capacitor pad 28 is electrically coupled to VIN potential and the second conductive layer 38 by a conductive via 84 which extends from the second capacitor pad 28 through the electrically insulating layer 41 to the pad 81 positioned on the top surface 35 of the high side switch and by the material of the body 83 of the high side switch 22 which is electrically coupled to the drain pad 26 positioned on the opposing side 37 of the high side switch 22 which is in turn electrically connected to the second conductive layer 38 and VIN package pad 25.

The first capacitor pad 27 is electrically coupled to the first conductive layer 24 and ground potential by the vertical conductive connection 53 which extends through the body of the low side switch 21 and includes a conductive via 55 which is electrically insulated from the body of the low side switch 21 and the conductive via 56 as in the semiconductor module 50 illustrated in FIGS. 3A and 3B.

In other embodiments, the electrically insulating layer 41 and conductive via 84 is omitted and the capacitor pad 28 is arranged directly on the upper surface 35 of the high side switch 22.

Figure 5D:
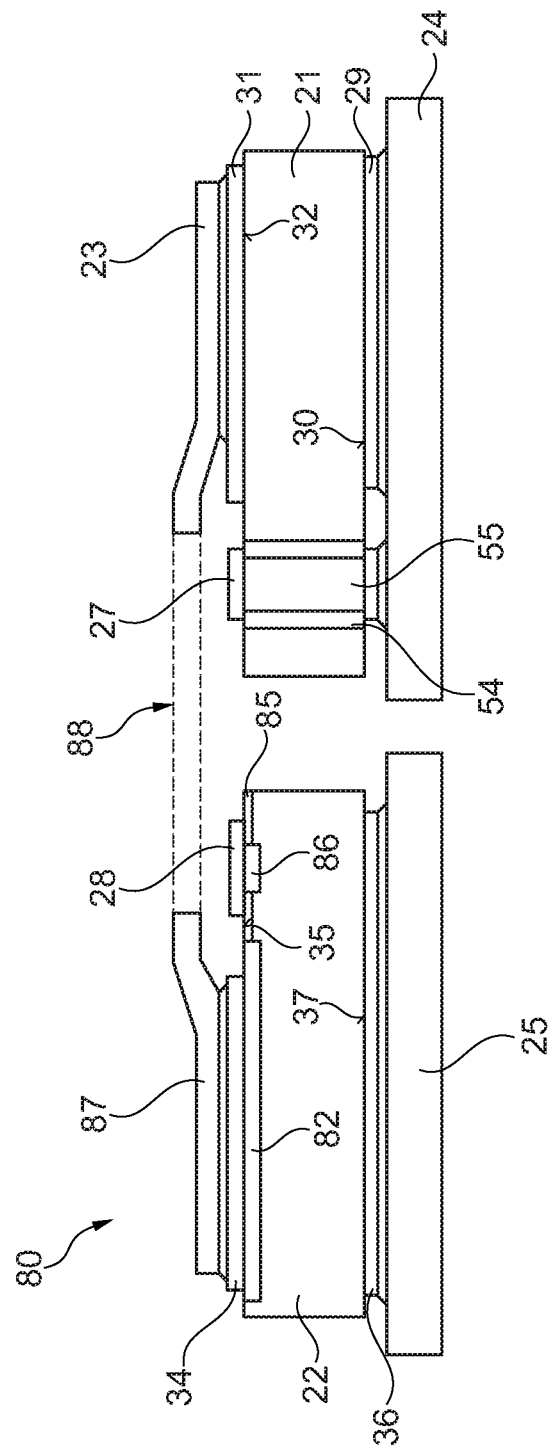

FIG. 5D illustrates a cross-sectional view of a semiconductor module 80 in which the pads 27, 28 for the capacitor may be arranged directly on the upper surface 35 of the high side switch 22 and the upper surface 30 of the low side switch 21, respectively. The third conductive layer 23 is provided by a contact clip 87 that has an opening 88 for the first and second capacitor pads 27, 28. The opening 88 has a lateral size and shape such that both of the first a second capacitor pads 27, 28 and peripheral regions of the low side switch 21 and high side switch 222 are exposed at the base of the opening 88. The clip 87 is arranged on the upper surface 35 of the high side switch 22 and the upper surface 30 of the low side switch 21 such that each of the first and second capacitor pads 27, 28 is arranged at the base of the hole 88. The capacitor, which is not illustrated in FIG. 5D, can be mounted in this hole 88 and extends between the first and second capacitors pads 27, 28 bridging the gap between the neighbouring side faces of the low side switch 21 and high side switch 22. This arrangement may be useful for a module having a package such as a PQFN package, which is fabricated without using a lamination process to embed the low side switch 21 and high side switch 22.

FIG. 6A illustrates a top view and FIG. 6B a side view of a semiconductor module 90 providing a power stage including two switches having a half bridge configuration and pads for a decoupling capacitor according to an embodiment. The semiconductor module 90 differs from the semiconductor module 50 illustrated in FIGS. 3A and 3B in the arrangement of the first vertical connection 53 between the first capacitor pad 27 and the first conductive layer 24 in relation to the low side switch 21. In the semiconductor module 90, a portion of the vertical conductive connection 53 has the form of a conductive layer 91 that is positioned on a side face 65 of the low side switch 21 rather than being positioned in a conductive via which is surrounded on all sides by the material of the low side switch 21. The conductive layer 91 which is positioned on the side face 65 may be electrically insulated from the low side switch 21 by an electrically insulating layer 92 which is positioned on the side face 65 of the low side switch 21. The first vertical connection 53 also includes the conductive via 56 which extends through the electrically insulating layer 41 positioned on the top surface 32 of the low side switch 21. This arrangement of a layer on the side face may be easier to manufacture than forming a conductive via through the thickness of the semiconductor die providing the switch.

In the semiconductor module 90, the second vertical conductive connection 59, which electrically connects the second capacitor pad 28 to the second conductive layer 38, is also includes a portion 93 in the form of a layer that is positioned on the side face 66 of the high side switch 22 rather than being positioned in a conductive via which is surrounded on all sides by the material of the high side switch 22. The conductive layer 60 may be electrically insulated from the body of the high side switch 22 by an isolation layer 94 is positioned on the side face 66. In embodiments in which the body of the high side switch 22 is at VIN potential, it is also possible for the conductive layer 93 to be positioned directly on the side face 66. The second vertical conductive connection 59 also includes the conductive via 62 that extends through the electrically insulating layer 41 and so is in contact with both the second capacitor pad 28 and the second conductive layer 38.

The arrangement of the first and second vertical connections 53, 59 within a semiconductor module may be the same for both the low side switch 21 and the high side switch 22 or may be different. For example, one of the vertical conductive connections 53, 59 of the semiconductor module 90 may be provided by means of a conductive via as used in the embodiment illustrated in FIGS. 3A and 3B, and the other one of the vertical conductive connections 53, 59 have a portion extending on the side face of the respective switch 21, 22 as illustrated in FIGS. 6A and 6B, for example.

In the semiconductor module 90 illustrated in FIGS. 6A and 6B, the first and second capacitor pad 27, 28 may partially overlap of the low side switch 21 and high side switch 22, and may extend over the peripheral edge of the low side switch 21 and high side switch 22 provided by the side face 65, 66 respectively.

In some embodiments, one or both of the capacitor pads 27, 28 may be positioned vertically above the respective switch but not overlap with the respective switch. In this embodiment, the capacitor pads are arranged laterally between the side faces 65, 66 of the low side switch 21 and high side switch 22 that face one another. This embodiment may be used to save lateral space compared to an arrangement in which the capacitor pads 27, 28 are arranged laterally adjacent side faces of the switches which do not face one another, e.g. to save space in the y direction. This embodiment may be used if the size of the capacitor is suitable for fitting in the available space between the side faces 65, 66 of the switches 21, 22 which face one another.

In some embodiments, for example the embodiments described with reference to FIGS. 2 to 6B, the semiconductor module is provided in a form where the capacitor pads 27, 28 are accessible from outside of the module so that a capacitor of the desired rating can be mounted on and electrically coupled to the capacitor pads 27, 28. For example, the capacitor can be soldered to the capacitor pads 27, 28. In embodiments in which the semiconductor module includes a moulding compound providing the outer surface of the module, the capacitor pads 27, 28 can be exposed from the moulding compound. In embodiments in which the module includes an upper electrically insulating layer, for example laminated or so-called embedded chip type modules, the first and second capacitor pads 27, 28 may be exposed from the electrically insulating material of the upper layer and accessible from outside of the module 90 from the top surface 96 of the module 90. The package pads 24, 25, 26 are arranged on the opposing side 95 of the module 90. These embodiments may be useful for applications in which the value of the capacitance depends on the use and operation of the circuit so that a capacitor with a suitable capacitance can be selected for the particular application and circuit in which the module is used.

In some embodiments, the semiconductor module further includes a capacitor that is mounted on and electrically connected to the capacitor pads 27, 28. These embodiments may be useful for standardized circuits where the appropriate value of the capacitance in known in advance.

In some embodiments, the semiconductor module may include more than one half bridge configuration, each including a low side switch and a high side switch. For example, semiconductor module may include three half bridge configurations to provide a three-phase inverter circuit. Each of the half bridge configurations within the module may have the same configuration simplifying manufacture. However, the configurations of each of the switches and half produce may differ depending on the requirements of a particular circuit.

In some embodiments, the semiconductor module is provided with an embedded capacitor. In these embodiments, the capacitor pads 27, 28 are positioned within an electrically insulating layer of the module and are not freely accessible from outside of the module.

FIG. 7A illustrates a top view and FIG. 7B a side view of a module 100 including an embedded decoupling capacitor 101 in addition to providing a power stage including two switches having a half bridge configuration and the pads for the decoupling capacitor. The capacitor 101 is mounted on and electrically coupled between the first capacitor pad 27 which is positioned vertically above the low side switch 21 and the second capacitor pad 28 which is positioned vertically above the high side switch 22.

The first capacitor pad 27 is coupled to the ground package pad 33 by a first vertical connection 53 which includes a conductive via 55 extending through the body of the low side switch 21 to the ground package pad 24 and the second capacitor pad 28 is electrically coupled by a second vertical connection structure 59 which includes a conductive via extending through the body of the high side switch 22 to the VIN package pad 25.

The capacitor 101 is embedded within an insulating layer 102 which is positioned on and covers the third conductive layer 23 and the top sides 32, 35 of the low side switch 21 and high side switch 22 as well as the capacitor 101. The package contact pads 24, 25 are positioned on the opposing surface 103 of the semiconductor module 100.

In this embodiment, the first conductive layer and the ground package pad 24 are provided by a first die pad of a leadframe on which the low side switch 21 and, in particular, the source pad 30 of the low side switch 21 is mounted. Similarly, the second conductive layer 38 and the VIN package pad 25 are provided by a second die pad of the leadframe on which the high side switch 22 and in particular, the drain pad 37 of the high side switch 22 is mounted. The third conductive layer 23 is electrically coupled by one or more conductive vias to a further portion of the leadframe that is positioned in a plane of the module 100 which cannot be seen in the cross-sectional view of FIG. 7B.

An arrangement, such as a leadframe, in which a single conductive portion provides the first conductive layer 33 and ground package pad 24 and a single conductive portion provides the second conductive layer 38 and VIN package pad 25 may also be used in the module according to the embodiments described with reference to FIGS. 2 to 6B.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor module, comprising:
   a low side switch;
   a high side switch, wherein the low side switch and the high side switch are arranged laterally adjacent one another and coupled in series between a ground package pad and a voltage input (VIN) package pad arranged on a first side of the semiconductor module and form a half bridge configuration having an output node;
a first capacitor pad coupled to ground potential; and
a second capacitor pad coupled to a VIN potential,
wherein the first capacitor pad is arranged vertically above the low side switch and the second capacitor pad is arranged vertically above the high side switch,
wherein the low side switch comprises a first side and a second side opposing the first side, a source pad on the first side, and a drain pad on the second side,
wherein the source pad of the low side switch is mounted on and electrically connected to a first conductive layer,
wherein the high side switch comprises a first side and a second side opposing the first side, a source pad on the first side, and a drain pad on the second side,
wherein the drain pad of the high side switch is mounted on and electrically connected to a second conductive layer that is substantially coplanar with the first conductive layer,
wherein the output node is formed by a third conductive layer extending between and electrically coupled to the drain pad of the low side switch and the source pad of the high side switch, and
wherein the third conductive layer comprises a first opening in which the first capacitor pad is arranged and a second opening in which the second capacitor pad is arranged, or a single opening in which the first capacitor pad and the second capacitor pad are arranged,
wherein the first capacitor pad and the second capacitor pad are each spaced apart from side walls defining the respective first opening, second opening, or single opening in which each of the first capacitor pad and the second capacitor pad is arranged.

2. The semiconductor module of claim 1, wherein the first capacitor pad is arranged vertically above the drain pad of the low side switch.

3. The semiconductor module of claim 2, wherein the second capacitor pad is arranged vertically above the source pad of the high side switch.

4. The semiconductor module of claim 1, wherein the third conductive layer is spaced apart from the drain pad of the low side switch and the source pad of the high side switch by an electrically insulating layer, and wherein the first capacitor pad is electrically insulated from the drain pad of the low side switch by the electrically insulating layer.

5. The semiconductor module of claim 1, further comprising a first vertical conductive connection that electrically couples the first capacitor pad with a ground layer of the semiconductor module.

6. The semiconductor module of claim 5, wherein the first vertical conductive connection comprises a conductive via extending through and electrically insulated from a body of the low side switch.

7. The semiconductor module of claim 5, wherein the first vertical conductive connection comprises a conductive via extending on a side face of the low side switch and electrically insulated from the body of the low side switch.

8. The semiconductor module of claim 5, wherein the ground package pad and the VIN package pad are arranged on a first side of the semiconductor module, wherein the ground package pad is coupled to the ground layer and the first conductive layer, and wherein the VIN package pad is coupled to the second conductive layer.

9. The semiconductor module of claim 1, further comprising a second vertical conductive connection that electrically couples the second capacitor pad with the VIN potential.

10. The semiconductor module of claim 9, wherein the second vertical conductive connection is provided by a conductive via extending through and electrically insulated from a body of the high side switch.

11. The semiconductor module of claim 9, wherein the second vertical conductive connection is provided by a conductive via extending on a side face of a body of the high side switch and electrically insulated from the body of the high side switch.

12. The semiconductor module of claim 9, wherein the second vertical conductive connection is provided by a body of the high side switch, wherein the second capacitor pad is arranged on the first side of the high side switch and is electrically coupled to the drain pad of the high side switch.

13. The semiconductor module of claim 1, further comprising a control chip.

14. The semiconductor module of claim 1, further comprising at least one further half bridge configuration comprising a low side switch and a high side switch.

15. The semiconductor module of claim 1, further comprising a capacitor extending between and electrically connected to the first capacitor pad and the second capacitor pad.

16. The semiconductor module of claim 1, wherein the first capacitor pad and the second capacitor pad are exposed from an upper electrically insulating layer forming an outer surface of the semiconductor module.

17. The semiconductor module of claim 1, wherein the first capacitor pad and the second capacitor pad are positioned within an upper electrically insulating layer forming an outer surface of the semiconductor module.

* * * * *